United States Patent
Yang et al.

(10) Patent No.: US 8,358,001 B2
(45) Date of Patent: Jan. 22, 2013

(54) SEMICONDUCTOR DEVICE PACKAGES, REDISTRIBUTION STRUCTURES, AND MANUFACTURING METHODS THEREOF

(75) Inventors: Hung-Jen Yang, Kaohsiung (TW); Chuehan Hsieh, Kaohsiung (TW); Min-Lung Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 347 days.

(21) Appl. No.: 12/649,265

(22) Filed: Dec. 29, 2009

(65) Prior Publication Data

US 2011/0018124 A1 Jan. 27, 2011

(30) Foreign Application Priority Data

Jul. 23, 2009 (TW) ................. 98124858 A

(51) Int. Cl.
*H01L 23/04* (2006.01)
(52) U.S. Cl. ........ 257/698; 257/690; 257/692; 257/700; 257/780; 257/797; 257/E23.037; 257/E23.179; 257/E21.499; 438/113; 438/127
(58) Field of Classification Search .............. 257/690, 257/692, 698, 700, 780, 797, E23.037, E23.179, 257/E21.499; 438/113, 127
See application file for complete search history.

(56) References Cited

U.S. PATENT DOCUMENTS

| | | |
|---|---|---|
| 3,959,874 A | 6/1976 | Coucoulas |
| 4,783,695 A | 11/1988 | Eichelberger et al. |
| 5,019,535 A | 5/1991 | Wojnarowski et al. |
| 5,091,769 A | 2/1992 | Eichelberger |
| 5,111,278 A | 5/1992 | Eichelberger |
| 5,120,678 A | 6/1992 | Moore et al. |
| 5,149,662 A | 9/1992 | Eichelberger |
| 5,151,776 A | 9/1992 | Wojnarowski et al. |
| 5,157,589 A | 10/1992 | Cole, Jr. et al. |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,422,513 A | 6/1995 | Marcinkiewicz et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,567,656 A | 10/1996 | Chun |
| 5,703,400 A | 12/1997 | Wojnarowski et al. |
| 5,710,062 A | 1/1998 | Sawai et al. |
| 5,745,984 A | 5/1998 | Cole, Jr. et al. |
| 5,834,340 A | 11/1998 | Sawai et al. |
| 5,841,193 A | 11/1998 | Eichelberger |
| 5,866,952 A | 2/1999 | Wojnarowski et al. |

(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof."

(Continued)

*Primary Examiner* — Meiya Li
(74) *Attorney, Agent, or Firm* — Foley & Lardner LLP

(57) ABSTRACT

Described herein are semiconductor device packages and redistribution structures including alignment marks and manufacturing methods thereof.

20 Claims, 9 Drawing Sheets

U.S. PATENT DOCUMENTS

| | | | |
|---|---|---|---|
| 6,046,071 A | 4/2000 | Sawai et al. | |
| 6,080,932 A | 6/2000 | Smith et al. | |
| 6,159,767 A | 12/2000 | Eichelberger et al. | |
| 6,232,151 B1 | 5/2001 | Ozmat et al. | |
| 6,239,482 B1 | 5/2001 | Fillion et al. | |
| 6,265,765 B1 | 7/2001 | DiStefano et al. | |
| 6,294,741 B1 | 9/2001 | Cole, Jr. et al. | |
| 6,306,680 B1 | 10/2001 | Fillion et al. | |
| 6,358,780 B1 | 3/2002 | Smith et al. | |
| 6,377,461 B1 | 4/2002 | Ozmat et al. | |
| 6,396,148 B1 | 5/2002 | Eichelberger et al. | |
| 6,426,545 B1 | 7/2002 | Eichelberger et al. | |
| 6,486,006 B2 | 11/2002 | Hirano et al. | |
| 6,555,908 B1 | 4/2003 | Eichelberger | |
| 6,586,822 B1 | 7/2003 | Vu et al. | |
| 6,680,529 B2 | 1/2004 | Chen et al. | |
| 6,701,614 B2 | 3/2004 | Ding et al. | |
| 6,818,544 B2 | 11/2004 | Eichelberger et al. | |
| 6,838,776 B2 | 1/2005 | Leal et al. | |
| 6,845,554 B2 | 1/2005 | Frankowsky et al. | |
| 6,921,683 B2 | 7/2005 | Nakayama | |
| 6,921,975 B2 | 7/2005 | Leal et al. | |
| 6,953,708 B2 | 10/2005 | Hedler et al. | |
| 7,015,075 B2 | 3/2006 | Fay et al. | |
| 7,045,908 B2 | 5/2006 | Ohsumi | |
| 7,048,450 B2 | 5/2006 | Beer et al. | |
| 7,087,991 B2 | 8/2006 | Chen et al. | |
| 7,091,595 B2 | 8/2006 | Fuergut et al. | |
| 7,112,467 B2 | 9/2006 | Eichelberger et al. | |
| 7,141,884 B2 | 11/2006 | Kojima et al. | |
| 7,145,228 B2 | 12/2006 | Yean et al. | |
| 7,163,843 B2 | 1/2007 | Kiendl et al. | |
| 7,294,791 B2 | 11/2007 | Danoski et al. | |
| 7,344,917 B2 | 3/2008 | Gautham | |
| 7,361,533 B1 | 4/2008 | Huemoeller et al. | |
| 7,361,987 B2 | 4/2008 | Leal et al. | |
| 7,364,944 B2 | 4/2008 | Huang et al. | |
| 7,371,617 B2 | 5/2008 | Tsai et al. | |
| 7,425,464 B2 | 9/2008 | Fay et al. | |
| 7,453,148 B2 | 11/2008 | Yang et al. | |
| 7,476,563 B2 | 1/2009 | Mangrum et al. | |
| 7,482,198 B2 | 1/2009 | Bauer et al. | |
| 7,501,310 B2 | 3/2009 | Yang et al. | |
| 7,511,365 B2 | 3/2009 | Wu et al. | |
| 7,514,767 B2 | 4/2009 | Yang | |
| 7,566,969 B2 | 7/2009 | Shimanuki | |
| 7,575,173 B2 | 8/2009 | Fuergut et al. | |
| 7,588,951 B2 | 9/2009 | Mangrum et al. | |
| 7,595,226 B2 | 9/2009 | Lytle et al. | |
| 7,595,553 B2 | 9/2009 | Nagamatsu et al. | |
| 7,619,304 B2 | 11/2009 | Bauer et al. | |
| 7,619,901 B2 | 11/2009 | Eichelberger et al. | |
| 7,622,733 B2 | 11/2009 | Fuergut et al. | |
| 7,655,501 B2 | 2/2010 | Yang et al. | |
| 7,662,667 B2 | 2/2010 | Shen | |
| 7,667,318 B2 | 2/2010 | Yang et al. | |
| 7,675,157 B2 | 3/2010 | Liu et al. | |
| 7,692,286 B1 | 4/2010 | Huemoeller et al. | |
| 7,714,431 B1 | 5/2010 | Huemoeller et al. | |
| 7,727,803 B2 | 6/2010 | Yamagata | |
| 7,732,242 B2 | 6/2010 | Brunnbauer et al. | |
| 7,741,151 B2 | 6/2010 | Amrine et al. | |
| 7,759,163 B2 | 7/2010 | Kroeninger et al. | |
| 7,763,976 B2 | 7/2010 | Tang et al. | |
| 7,767,495 B2 | 8/2010 | Fuergut et al. | |
| 7,807,512 B2 | 10/2010 | Lee et al. | |
| 7,812,434 B2 | 10/2010 | Yang | |
| 7,830,004 B2 | 11/2010 | Wu et al. | |
| 7,834,464 B2 | 11/2010 | Meyer et al. | |
| 7,932,599 B2 | 4/2011 | Kiendl et al. | |
| 7,948,090 B2 | 5/2011 | Manepalli et al. | |
| 8,017,515 B2 | 9/2011 | Marimuthu et al. | |
| 8,039,303 B2 | 10/2011 | Shim et al. | |
| 2003/0090883 A1 | 5/2003 | Asahi et al. | |
| 2004/0012099 A1 | 1/2004 | Nakayama | |
| 2004/0178500 A1 | 9/2004 | Usui | |
| 2005/0253244 A1* | 11/2005 | Chang | 257/692 |
| 2006/0065387 A1 | 3/2006 | Tonapi et al. | |
| 2006/0231944 A1 | 10/2006 | Huang et al. | |
| 2007/0096311 A1 | 5/2007 | Humpston et al. | |
| 2007/0176281 A1 | 8/2007 | Kim et al. | |
| 2007/0222054 A1 | 9/2007 | Hembree | |
| 2007/0234563 A1 | 10/2007 | Sakaguchi et al. | |
| 2008/0137314 A1 | 6/2008 | Salama et al. | |
| 2009/0075428 A1 | 3/2009 | Tang et al. | |
| 2009/0101400 A1 | 4/2009 | Yamakoshi | |
| 2009/0102066 A1 | 4/2009 | Lee et al. | |
| 2009/0127686 A1 | 5/2009 | Yang et al. | |
| 2009/0129037 A1 | 5/2009 | Yoshino | |
| 2009/0224391 A1 | 9/2009 | Lin et al. | |
| 2009/0236686 A1 | 9/2009 | Shim et al. | |
| 2009/0261466 A1 | 10/2009 | Pagaila et al. | |
| 2010/0006330 A1 | 1/2010 | Fu et al. | |
| 2010/0006994 A1 | 1/2010 | Shim et al. | |
| 2010/0072599 A1 | 3/2010 | Camacho et al. | |
| 2010/0072618 A1 | 3/2010 | Camacho et al. | |
| 2010/0084759 A1 | 4/2010 | Shen | |
| 2010/1091332 | 5/2010 | Ko et al. | |
| 2010/0214780 A1 | 8/2010 | Villard | |
| 2010/0224983 A1 | 9/2010 | Huang et al. | |
| 2010/0244208 A1 | 9/2010 | Pagaila et al. | |
| 2010/0308449 A1 | 12/2010 | Yang et al. | |
| 2010/0314746 A1 | 12/2010 | Hsieh et al. | |
| 2010/0320585 A1 | 12/2010 | Jiang et al. | |
| 2010/0320593 A1 | 12/2010 | Weng et al. | |
| 2011/0018118 A1 | 1/2011 | Hsieh et al. | |
| 2011/0068453 A1 | 3/2011 | Cho et al. | |
| 2011/0115060 A1 | 5/2011 | Chiu et al. | |
| 2011/0127654 A1 | 6/2011 | Weng et al. | |
| 2011/0140364 A1 | 6/2011 | Head | |
| 2011/0169150 A1 | 7/2011 | Su et al. | |
| 2011/0177654 A1 | 7/2011 | Lee et al. | |
| 2011/0194265 A1 | 8/2011 | Su et al. | |
| 2011/0227220 A1 | 9/2011 | Chen et al. | |
| 2011/0241192 A1 | 10/2011 | Ding et al. | |
| 2011/0241193 A1 | 10/2011 | Ding et al. | |
| 2011/0241194 A1 | 10/2011 | Chen et al. | |
| 2011/0278741 A1 | 11/2011 | Chua et al. | |
| 2011/0309488 A1 | 12/2011 | Pagaila | |
| 2012/0038053 A1 | 2/2012 | Oh et al. | |
| 2012/0056321 A1 | 3/2012 | Pagaila | |
| 2012/0077311 A1 | 3/2012 | Kim et al. | |
| 2012/0119373 A1 | 5/2012 | Hunt | |
| 2012/0153472 A1 | 6/2012 | Pagaila et al. | |
| 2012/0153493 A1 | 6/2012 | Lee et al. | |
| 2012/0175732 A1 | 7/2012 | Lin et al. | |
| 2012/0199972 A1 | 8/2012 | Pagaila et al. | |

OTHER PUBLICATIONS

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

* cited by examiner

SEMICONDUCTOR DEVICE PACKAGES, REDISTRIBUTION STRUCTURES, AND MANUFACTURING METHODS THEREOF

CROSS REFERENCE TO RELATED APPLICATION

This application claims the benefit of Taiwan Application Serial No. 98124858, filed on Jul. 23, 2009, the disclosure of which is incorporated herein by reference in its entirety.

FIELD OF THE INVENTION

The disclosure relates, in general, to semiconductor device packages and, more particularly, to semiconductor device packages and redistribution structures including alignment marks and manufacturing methods thereof.

BACKGROUND

Unlike conventional packaging technology that processes a single chip at a time, advanced wafer-level packaging technology can process an entire redistribution structure. In other words, multiple chips included in the redistribution structure can be processed together before the chips are separated individually, hence simplifying a back-end process of chip packaging and reducing manufacturing time and cost. That is, the back-end process can be applied to the entire redistribution structure, and then the redistribution structure can be sawn into multiple, individual semiconductor device packages. In view of these benefits, advanced wafer-level packaging technology is becoming a mainstream technology of semiconductor device packages.

During the fabrication of a redistribution structure, multiple devices can be sawn from a wafer and positioned on a carrier. The devices can include multiple chips with circuit functionality and multiple alignment dies. In a subsequent exposure process, a mask alignment tool can position a mask to perform an exposure process for forming a dielectric layer or an electrically conductive layer on the redistribution structure surface, according to the alignment dies included in the redistribution structure. Unfortunately, the chips on the carrier may be misplaced or may be displaced during the fabrication of the redistribution structure, and an alignment bias can result from such misplacement or displacement. In some instances, the alignment bias can be as high as +/−10 µm. As a result, a fabricated pattern, such as a pattern of a dielectric layer or an electrically conductive layer, can be displaced to an undesirable extent, relative to its intended position in the absence of an alignment bias.

It is against this background that a need arose to develop the semiconductor device packages, redistribution structures, and manufacturing methods described herein.

SUMMARY

The disclosure is directed to semiconductor device packages and redistribution structures including alignment marks and manufacturing methods thereof. According to some embodiments, after a set of semiconductor devices are positioned on a carrier, a set of alignment marks are formed in conjunction with the formation of a layer adjacent to a redistribution structure surface, and the alignment marks can serve as a positioning reference for forming a subsequent layer adjacent to the redistribution structure surface. In such manner, a mask can be precisely aligned to account for possible displacements of the semiconductor devices, and a resulting pattern can be fabricated with a high level of precision.

One aspect of the disclosure relates to semiconductor device packages. In one embodiment, a semiconductor device package includes: (1) a semiconductor device including an active surface, side surfaces, and contact pads disposed adjacent to the active surface; (2) a sealant enveloping the side surfaces of the semiconductor device and exposing the contact pads; (3) a first dielectric layer disposed adjacent to the sealant and the active surface of the semiconductor device, wherein the first dielectric layer defines first apertures that expose respective ones of the contact pads; (4) an electrically conductive layer disposed adjacent to the first dielectric layer and electrically connected to the contact pads through the first apertures; and (5) a second dielectric layer disposed adjacent to the electrically conductive layer, wherein at least one of the first dielectric layer and the electrically conductive layer is formed with an alignment mark, and the alignment mark is laterally disposed so as to overlap at least one of the sealant and the active surface of the semiconductor device.

Another aspect of the disclosure relates to redistribution structures. In one embodiment, a redistribution structure includes: (1) semiconductor devices, each including an active surface, side surfaces, and contact pads disposed adjacent to the active surface; (2) a sealant enveloping the side surfaces of the semiconductor devices with the contact pads of the semiconductor devices being exposed, wherein the sealant includes a sealant surface and defines at least one sawing path disposed between neighboring semiconductor devices; and (3) a first dielectric layer disposed adjacent to the sealant surface and the active surfaces of the semiconductor devices, wherein the first dielectric layer defines first apertures that expose respective ones of the contact pads of the semiconductor devices; (4) an electrically conductive layer disposed adjacent to the first dielectric layer and electrically connected to the contact pads of the semiconductor devices through the first apertures; and (5) a second dielectric layer disposed adjacent to the electrically conductive layer, wherein at least one of the first dielectric layer and the electrically conductive layer is formed with an alignment mark, and the alignment mark is laterally disposed so as to overlap at least one of the sealant surface, the sawing path, and the active surfaces of the semiconductor devices.

Another aspect of the disclosure relates to manufacturing methods. In one embodiment, a manufacturing method includes: (1) providing a carrier and an adhesion layer disposed adjacent to the carrier; (2) positioning semiconductor devices adjacent to the adhesion layer, wherein each of the semiconductor devices includes an active surface, side surfaces, and contact pads disposed adjacent to the active surface, and the active surfaces of the semiconductor devices face the adhesion layer; (3) enveloping the sides surfaces of the semiconductor devices with a sealant to form a redistribution structure; (4) removing the carrier and the adhesion layer, so that the redistribution structure exposes the contact pads of the semiconductor devices; (5) forming a first dielectric layer adjacent to the sealant and the active surfaces of the semiconductor devices, wherein the first dielectric layer is formed with an alignment mark, and the first dielectric layer defines first apertures that expose respective ones of the contact pads of the semiconductor devices; (6) using the alignment mark as a positioning reference, forming an electrically conductive layer adjacent to the first dielectric layer and electrically connected to the contact pads of the semiconductor devices through the first apertures; (7) forming a second dielectric layer adjacent to the electrically conductive layer, wherein the second dielectric layer defines second apertures that expose contact surfaces of the electrically conductive layer; (8) positioning conductive bumps adjacent to the second dielectric layer, so that the conductive bumps are electrically connected to the electrically conductive layer through the second apertures; and (9) singulating the redistribution structure to form semiconductor device packages.

In another embodiment, a manufacturing method includes: (1) providing a carrier and an adhesion layer disposed adjacent to the carrier; (2) positioning semiconductor devices adjacent to the adhesion layer, wherein each of the semiconductor devices includes an active surface, side surfaces, and contact pads disposed adjacent to the active surface, and the active surfaces of the semiconductor devices face the adhesion layer; (3) enveloping the sides surfaces of the semiconductor devices with a sealant to form a redistribution structure; (4) removing the carrier and the adhesion layer, so that the redistribution structure exposes the contact pads of the semiconductor devices; (5) forming a first dielectric layer adjacent to the sealant and the active surfaces of the semiconductor devices, wherein the first dielectric layer defines first apertures that expose respective ones of the contact pads of the semiconductor devices; (6) forming an electrically conductive layer adjacent to the first dielectric layer and electrically connected to the contact pads of the semiconductor devices through the first apertures, wherein the electrically conductive layer is formed with an alignment mark; (7) using the alignment mark as a positioning reference, forming a second dielectric layer adjacent to the electrically conductive layer, wherein the second dielectric layer defines second apertures that expose contact surfaces of the electrically conductive layer; (8) positioning conductive bumps adjacent to the second dielectric layer, so that the conductive bumps are electrically connected to the electrically conductive layer through the second apertures; and (9) singulating the redistribution structure to form semiconductor device packages.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the disclosure. These definitions may likewise be expanded upon herein.

As used herein, the singular terms "a," "an," and "the" include plural referents unless the context clearly dictates otherwise. Thus, for example, reference to an alignment mark can include multiple alignment marks unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
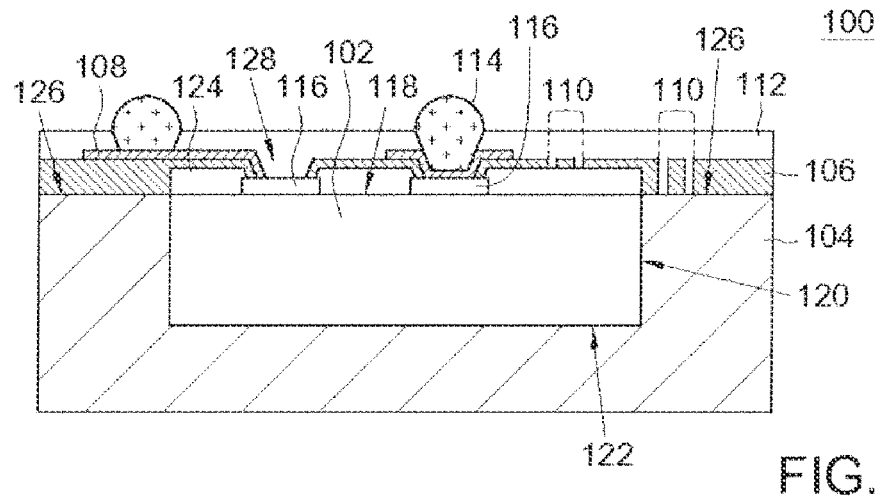
FIG. 1 shows a semiconductor device package according to an embodiment of the disclosure.

Referring to FIG. 1, a semiconductor device package 100 according to a first embodiment of the disclosure is shown. The semiconductor package 100 includes a semiconductor device 102 (e.g., a chip), a sealant or a package body 104, a first, patterned dielectric layer 106, a patterned electrically conductive layer 108, a set of alignment marks 110, a second, patterned dielectric layer 112, and a set of conductive bumps 114 (e.g., solder balls). While three layers are shown in FIG. 1, it is contemplated that more or less layers can be included for other embodiments.

The chip 102, having an active surface 118, includes multiple contact pads 116 and a passivation layer 124. Both the pads 116 and the passivation layer 124 are disposed adjacent to the active surface 118. The passivation layer 124 defines or is otherwise formed with apertures or openings that are aligned with respective ones of the pads 116 so as to expose the pads 116.

The first dielectric layer 106 is formed adjacent to a sealant surface 126 of the sealant 104 and the passivation layer 124 of the chip 102. The first dielectric layer 106 defines or is otherwise formed with first apertures 128 that are aligned with respective ones of the pads 116 so as to expose the pads 116. The first dielectric layer 106 can be formed from a dielectric material that is non-polymeric or polymeric, such as polyimide, polybenzoxazole, benzocyclobutene, or a combination thereof. For example, the first dielectric layer 106 can be formed from a dielectric material that is photoimageable or photoactive, thereby reducing manufacturing cost and time by allowing patterning using photolithography, and a thickness of the first dielectric layer 106 can be in the range of about 1 µm to about 12 µm, such as from about 1 µm to about 10 µm or from about 2 µm to about 6 µm.

The electrically conductive layer 108 is formed adjacent to a portion of the first dielectric layer 106 and extends into the first apertures 128 so as to be electrically connected to the pads 116. The electrically conductive layer 108 can be formed from a metal, a metal alloy, a matrix with a metal or a metal alloy dispersed therein, or another suitable electrically conductive material. For example, the electrically conductive layer 108 can be formed from aluminum, copper, titanium, or a combination thereof, and a thickness of the electrically conductive layer 108 can be in the range of about 1 µm to about 12 µm, such as from about 1 µm to about 10 µm or from about 2 µm to about 6 µm.

The sealant 104 covers or envelops side surfaces 120 and a bottom surface 122 of the chip 102, while exposing the active surface 118. It is also contemplated that the sealant 104 can cover the side surfaces 120 of the chip 102, while exposing both the active surface 118 and the bottom surface 122. The sealant 104 can be formed from a molding material, such as a Novolac-based resin, an epoxy-based resin, a silicone-based resin, or another suitable encapsulant. Suitable fillers also can be included, such as powdered $SiO_2$. The solder balls 114 are electrically connected to the pads 116 through contact surfaces on the electrically conductive layer 108. In accordance with a fan-out configuration of the semiconductor package 100, at least a portion or a subset of the solder balls 114 are laterally disposed outside of a periphery of the chip 102 (as defined by the side surfaces 120) and overlapping the sealant surface 126 (as viewed from the top or the bottom), although it is contemplated that the solder balls 114, in general, can be laterally disposed within that periphery, outside of that periphery, or both. In such manner, the fan-out configuration of the semiconductor package 100 allows a greater number of the solder balls 114 as well as a greater flexibility in terms of the arrangement and spacing of the solder balls 114, with reduced dependence upon the arrangement and spacing of the pads 116 of the chip 102.

The second dielectric layer 112 is formed adjacent to the electrically conductive layer 108. The second dielectric layer 112 defines or is otherwise formed with apertures that are sized to accommodate the solder balls 114 and are aligned with respect to the electrically conductive layer 108 so as to expose contact surfaces of the electrically conductive layer 108. Like the first dielectric layer 106, the second dielectric layer 112 can be formed from a dielectric material that is non-polymeric or polymeric, such as polyimide, polybenzoxazole, benzocyclobutene, or a combination thereof. For example, the second dielectric layer 112 can be formed from a dielectric material that is photoimageable or photoactive, thereby reducing manufacturing cost and time by allowing patterning using photolithography, and a thickness of the second dielectric layer 112 can be in the range of about 1 µm to about 12 µm, such as from about 1 µm to about 10 µm or from about 2 µm to about 6 µm.

In this embodiment of the disclosure, the alignment marks 110 are formed in the first dielectric layer 106. One subset of the alignment marks 110 is laterally disposed within the periphery of the chip 102 (as defined by the side surfaces 120) and overlapping the active surface 118 (as viewed from the top or the bottom), and another subset of the alignment marks 110 is laterally disposed outside of the periphery of the chip 102 and overlapping the sealant surface 126 (as viewed from the top or the bottom) so as to be within a periphery of the sealant 104 (as defined by side surfaces of the sealant 104). However, this arrangement is by way of example. In other embodiments, for example, all of multiple alignment marks may overlap either one of the sealant surface 126 and the active surface 118, but not both. Or, for example, a single alignment mark can be included to overlap either, or both, of the sealant surface 126 and the active surface 118. Or, for example, multiple alignment marks may overlap the sealant surface 126, and additional, multiple alignment marks may overlap the active surface 118.

The alignment marks 110 provide a positioning reference for a mask that is used to form the electrically conductive layer 108 and increase the precision in sizing and patterning of the electrically conductive layer 108. In turn, the greater precision in the formation of the electrically conductive layer 108 increases the precision in sizing and patterning of the second dielectric layer 112. In general, the alignment marks 110 can be implemented as visual cues or any other detectable or measured cues to aid the positioning of the mask, such as by an exposing tool. For example, the alignment marks 110 can be implemented in the form of surface patterning or other deviations from planarity, such as a set of recesses, a set of protrusions, or both. The formation and other features of the alignment marks 110 are disclosed as follows with respect to a manufacturing method.

Figure 2:
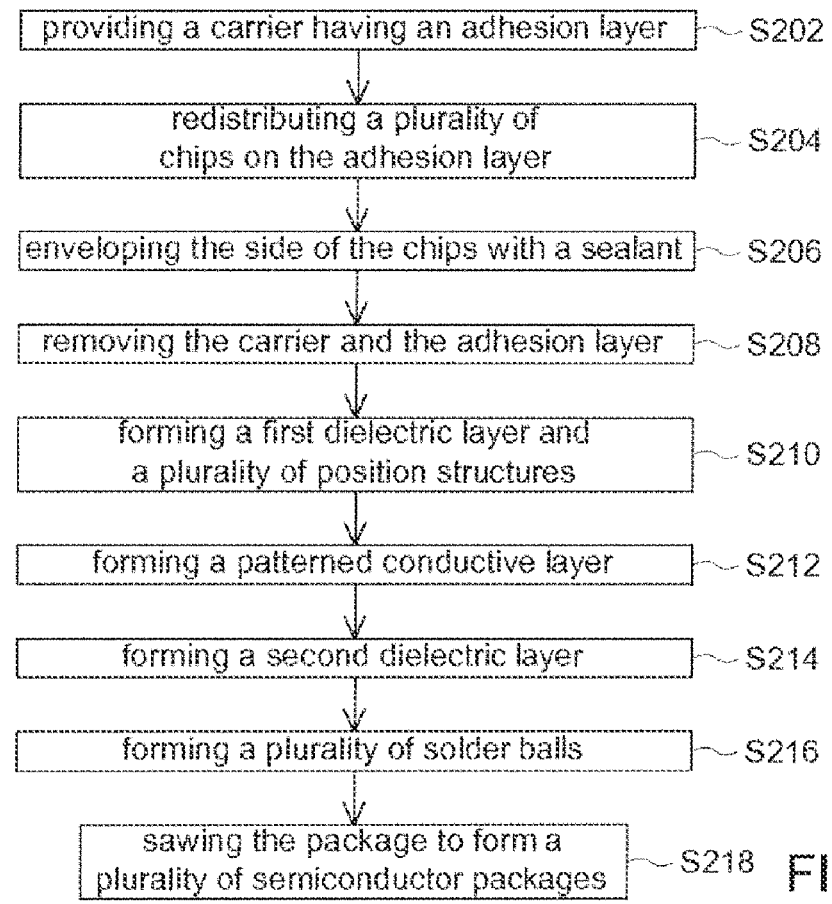
FIG. 2 shows a flow chart of a manufacturing method to form the semiconductor device package of FIG. 1, according to an embodiment of the disclosure.

Referring to FIG. 2, a manufacturing method of the semiconductor package 100 according to the first embodiment of the disclosure is shown. Referring to FIG. 3A through FIG. 3I, various operations or stages of the manufacturing method are shown.

Figure 3A:
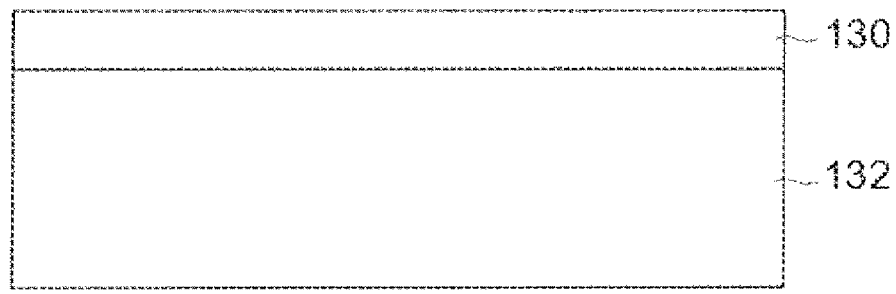
FIG. 3A through FIG. 3I show operations of a manufacturing method to form the semiconductor device package of FIG. 1, according to an embodiment of the disclosure.

In operation S202, as indicated in FIG. 2 and FIG. 3A, a carrier 132 is provided, and an adhesion layer 130 is positioned adjacent to a top surface of the carrier 132. The adhesion layer 130 can be implemented as a single-sided or double-sided adhesive tape.

Figure 3B:
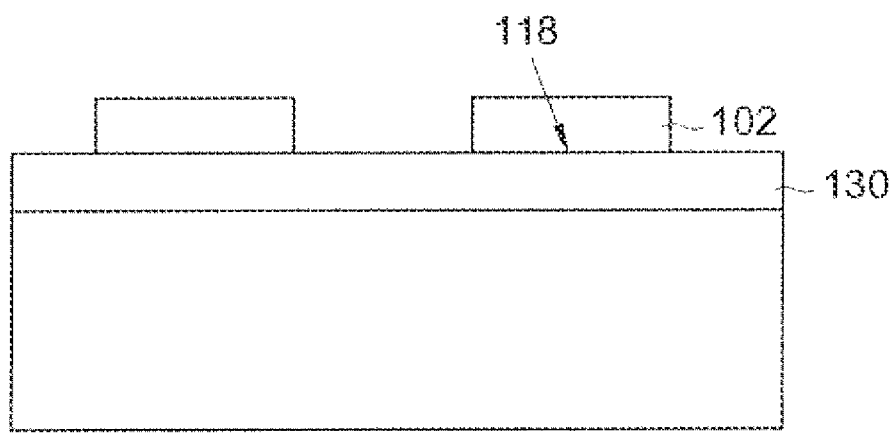

In operation S204, as indicated in FIG. 2 and FIG. 3B, multiple chips 102 are positioned adjacent to the adhesion layer 130, thereby redistributing the chips 102 adjacent to the carrier 132. Each chip 102 includes multiple contact pads 116 and a passivation layer 124 (as illustrated in FIG. 1) and an active surface 118. The pads 116 are disposed adjacent to the active surface 118, wherein the active surface 118 faces the adhesion layer 130. In addition to the chips 102, multiple alignment dies (not illustrated) are positioned adjacent to the adhesion layer 130.

Figure 3C:
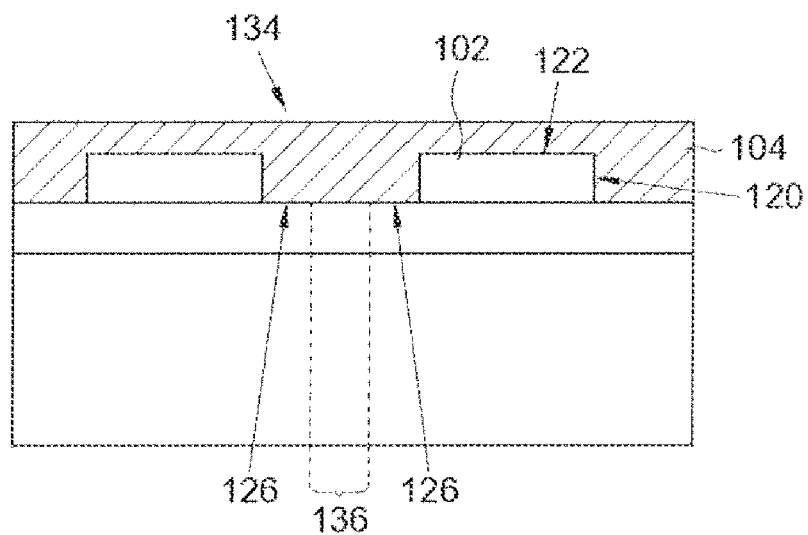

In operation S206, as indicated in FIG. 2 and FIG. 3C, side surfaces 120 and bottom surfaces 122 of each chip 102 are covered or enveloped with a sealant 104, so that the sealant 104 and the chips 102 form a redistribution structure 134, which can also be referred to as a reconstituted wafer. The sealant 104 includes a sealant surface 126 surrounding each chip 102 and has a sawing path 136 located between neighboring chips 102 and neighboring sealant surfaces 126.

Figure 3D:
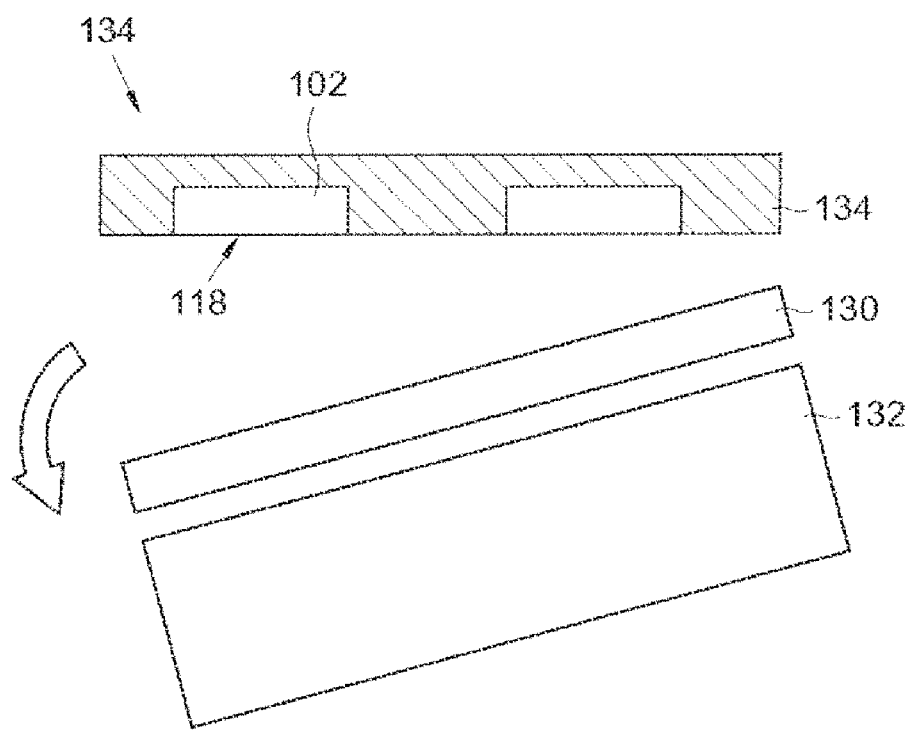

In operation S208, as indicated in FIG. 2 and FIG. 3D, the carrier 132 and the adhesion layer 130 are removed or separated, so that the redistribution structure 134 exposes the active surfaces 118 of the chips 102.

In FIG. 3D, the active surfaces 118 face downwards. By inverting the redistribution structure 134, the active surfaces 118 face upwards as indicated in FIG. 3E.

Figure 3E:
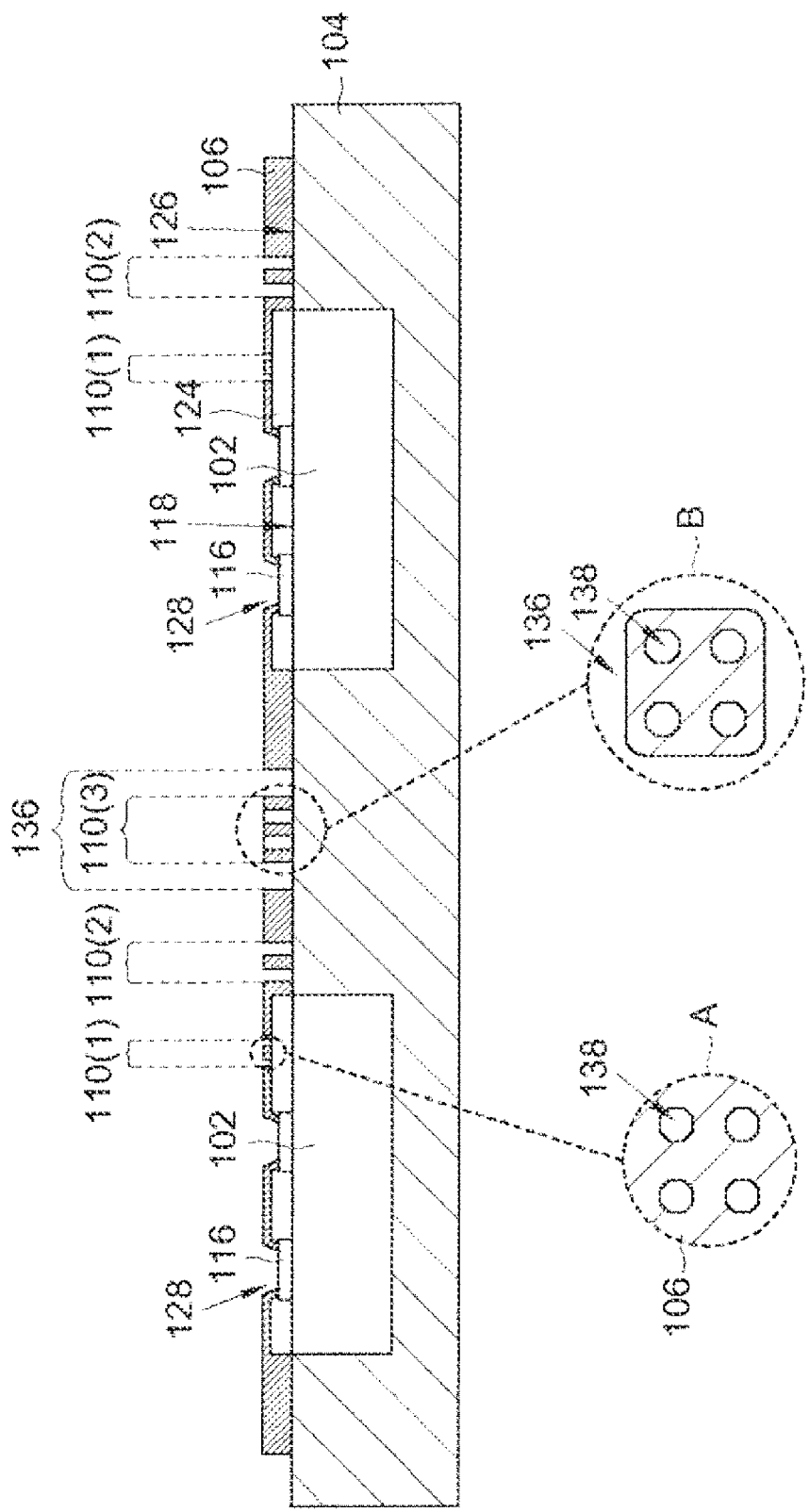

In operation S210, as indicated in FIG. 2 and FIG. 3E, a mask alignment tool (not illustrated) references the alignment dies to position a mask at an exposure position to form a first dielectric layer 106 on the sealant surfaces 126 and the passivation layers 124 of the chips 102. In operation S210, multiple, first apertures 128 are formed in the first dielectric layer 106 to expose the pads 116.

In operation S210, during the formation of the first dielectric layer 106, alignment marks or position structures 110 are formed in conjunction. That is, the alignment marks 110 and the first dielectric layer 106 can be formed in accordance with the same exposure process. Thus, the alignment marks 110 can be formed without employing additional manufacturing facilities, hence reducing manufacturing cost and time.

Figure 4:
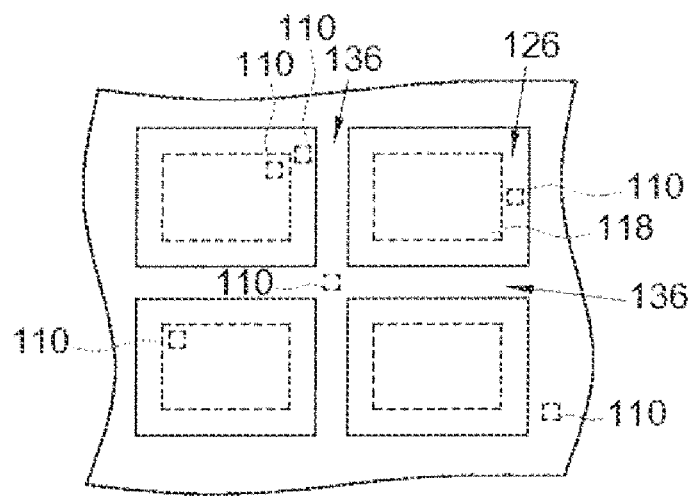
FIG. 4 shows a top view of a redistribution structure formed with a set of alignment marks, according to an embodiment of the disclosure.

The alignment marks 110 can overlap at least one of the sealant surfaces 126, at least one of the active surfaces 118, the sawing path 136, or a combination thereof. Referring to FIG. 4, a top view of a redistribution structure formed with alignment marks 110 according to an embodiment of the disclosure is shown. In this embodiment, one subset of the alignment marks 110 (e.g., 110(1) indicated in FIG. 3E) is laterally disposed within a periphery of a chip 102 and overlapping an active surface 118, another subset of the alignment marks 110 (e.g., 110(2) indicated in FIG. 3E) is laterally disposed outside of the periphery of the chip 102 and overlapping a sealant surface 126, and another subset of the alignment marks 110 (e.g., 110(3) indicated in FIG. 3E) is laterally disposed so as to overlap the sawing path 136. However, this arrangement is by way of example. In other embodiments, for example, an alignment mark may overlap a single one of the sealant surface 126, the active surface 118, and the sawing path 136, or may be laterally disposed adjacent to a boundary between neighboring ones of the sealant surface 126, the active surface 118, and the sawing path 136. According to the disclosure, alignment marks can be arranged in a number of ways as long as a mask can be aligned according to the alignment marks.

Referring to FIG. 3E, the alignment marks 110 are formed after redistribution of the chips 102, and can account for or offset any displacement of the chips 102 (e.g., relative to the alignment dies), thereby avoiding or reducing alignment bias resulting from such displacement. Moreover, in operation S210, the alignment marks 110 can be formed using a mask alignment tool having a relatively high precision, such as a tolerance level of +/−5 μm or smaller. Thus, in a subsequent process, sizing and patterning of a layer fabricated by a mask can reference the alignment marks 110 to achieve a high level of precision.

Figure 3F:
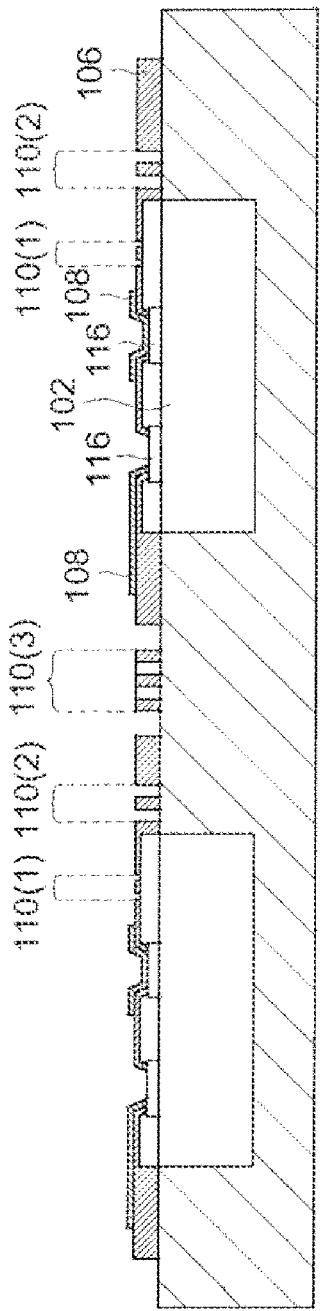

Multiple ones of the alignment marks 110 can be used for positioning a mask that is used for forming a layer, such as an electrically conductive layer 108 illustrated in FIG. 3F, using an exposing tool, such as a stepper. In some instances, the number of the alignment marks 110 is at least five or at least ten, so that the stepper can have a high level of precision in the alignment of the mask. However, the number of the alignment marks 110 can be suitably adjusted according to a particular exposing tool, and can vary for other embodiments of the disclosure.

Figure 5:
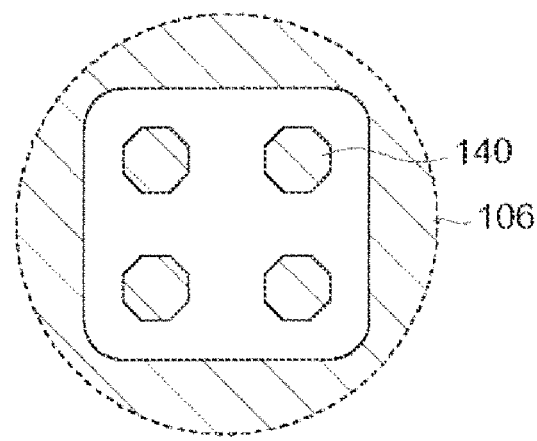
FIG. 5 shows an alignment mark according to another embodiment of the disclosure.

A shape of the alignment marks 110 is disclosed below. Referring to FIG. 3E, a top view of a partial enlargement of area A and area B is shown. The alignment marks 110(1), 110(2) and 110(3), which overlap the active surface 118, the sealant surface 126, and the sawing path 136, respectively, each includes multiple recesses, namely four cylindrical recesses 138, arranged according to a particular spatial pattern, such as according to corners of a polygonal shape or four corners of a rectangle. However, this arrangement is by way of example. While the recesses 138 fully extend through the first dielectric layer 106, the extent of the recesses 138 can vary for other embodiments, and, for example, the recesses 138 can partially extend through the first dielectric layer 106. Referring to FIG. 5, an alignment mark according to another embodiment of the disclosure is shown. In this embodiment, the alignment mark, which can overlap any one or more of the active surface 118, the sealant surface 126, and the sawing path 136, includes multiple protrusions, namely four cylindrical protrusions 140, arranged according to a particular spatial pattern, such as according to corners of a polygonal shape or four corners of a rectangle, and disposed within or surrounded by a recess. While a thickness of the protrusions 140 substantially corresponds to that of a remaining portion of the first dielectric layer 106, the thickness of the protrusions 140 can vary for other embodiments, and, for example, the protrusions 140 can extend above (or be recessed below) a top surface of a remaining portion of the first dielectric layer 106.

Referring back to FIG. 3E, as the recesses 138 extend through the first dielectric layer 106, structures under the first dielectric layer 106, such as the sealant 104 and the passivation layer 124, can be exposed.

The shape of the alignment marks 110 is provided by way of example. In other embodiments, the alignment marks 110 can also be arranged in other shapes as long as a mask can be precisely aligned by referencing the alignment marks 110. Also, the number of recesses and protrusions is provided by way of example, and, in other embodiments, the number of recesses or protrusions can be less than or more than four. A cross-sectional shape of the recesses or protrusions is exemplified by a substantially polygonal shape, namely an octagon. However, in other embodiments, a cross-sectional shape of the recesses or protrusions can be any other regular or irregular shapes, such as substantially in the form of a rectangle, a circle, an ellipse, or a triangle, as long as a mask can be precisely aligned by referencing the alignment marks 110.

In operation S212, as indicated in FIG. 2 and FIG. 3F, the electrically conductive layer 108 is formed adjacent to the first dielectric layer 106 and is electrically connected to the pads 116.

In operation S212, a mask alignment tool (not illustrated) references the alignment marks 110 to position a mask at an exposure position to form the electrically conductive layer 108.

In the embodiment, because the alignment marks 110 are formed after the chips 102 are redistributed, alignment bias can be avoided or reduced. Thus, in operation S212, the mask can be aligned according to the alignment marks 110 that are formed after the redistribution of the chips 102, so that layers formed after the first dielectric layer 106, such as the electrically conductive layer 108 and a second dielectric layer 112, can have a greater level of precision. That is, the embodiment allows fabrication of the electrically conductive layer 108 with more precisely positioned and thinner traces and with smaller intervals between the traces, so that a size of a resulting semiconductor package 100 can be further reduced.

Figure 3G:
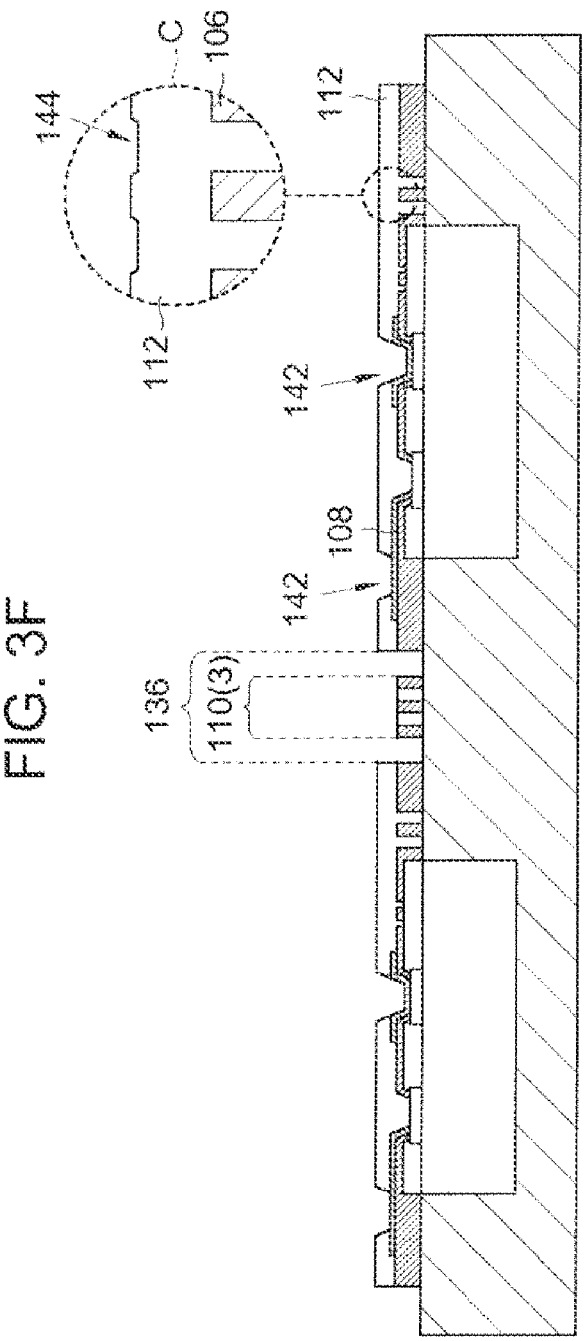

In operation S214, as indicated in FIG. 2 and FIG. 3G, the second dielectric layer 112 is formed adjacent to the electrically conductive layer 108. The second dielectric layer 112 is formed with multiple, second apertures 142 for exposing contact surfaces of the electrically conductive layer 108.

In operation S214, a mask alignment tool (not illustrated) references the alignment marks 110 to position a mask at an exposure position to form the second dielectric layer 112. Alternatively, or in conjunction, the mask alignment tool, according to the alignment dies, positions the mask to form the second dielectric layer 112. According to a precision level desired for the second dielectric layer 112, the alignment marks 110 or the alignment dies can be selected for positioning the mask.

As the recesses 138 are filled with a portion of the second dielectric layer 112, a slightly indented area 144 is formed adjacent to a top surface of the second dielectric layer 112, as indicated in a partial enlargement of area C of FIG. 3G. In particular, the indented area 144 includes four recesses corresponding to the four recesses 138. Alternatively, in the case of the cylindrical protrusions 140 of FIG. 5, then the peripheral recess surrounding the cylindrical protrusions 140 of FIG. 5 is filled with a portion of the second dielectric layer 112, and a top surface of the second dielectric layer 112 can have an indented area (not illustrated) similar to the indented area 144 of FIG. 3G. However, such indentation is by way of example, and the second dielectric layer 112 may not include such indentation, such as if the second dielectric layer 112 has a sufficient thickness.

Figure 3H:
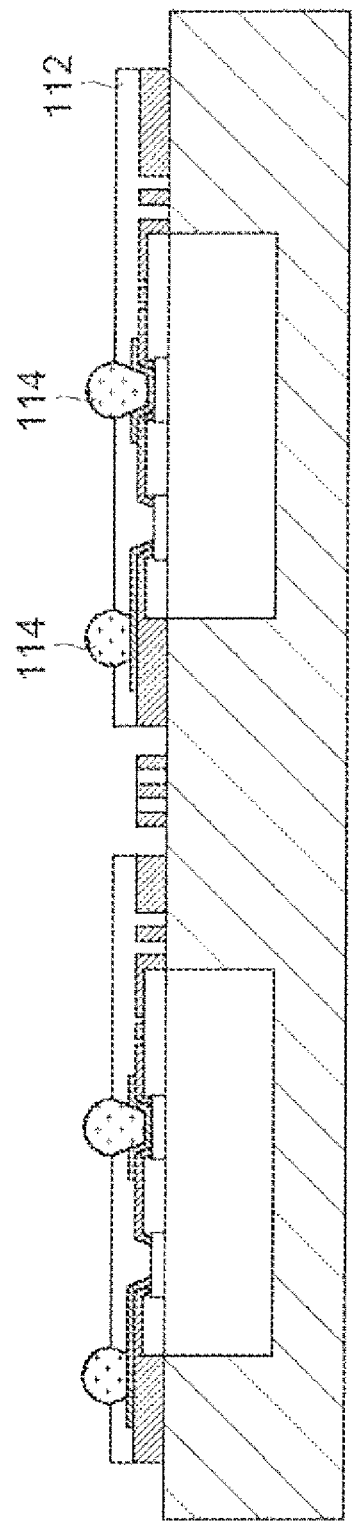

In operation S216, as indicated in FIG. 2 and FIG. 3H, multiple solder balls 114 are disposed adjacent to the second dielectric layer 112 and accommodated within the second apertures 142 (as illustrated in FIG. 3G), so that the solder balls 114 are electrically connected to the electrically conductive layer 108.

Figure 3I:
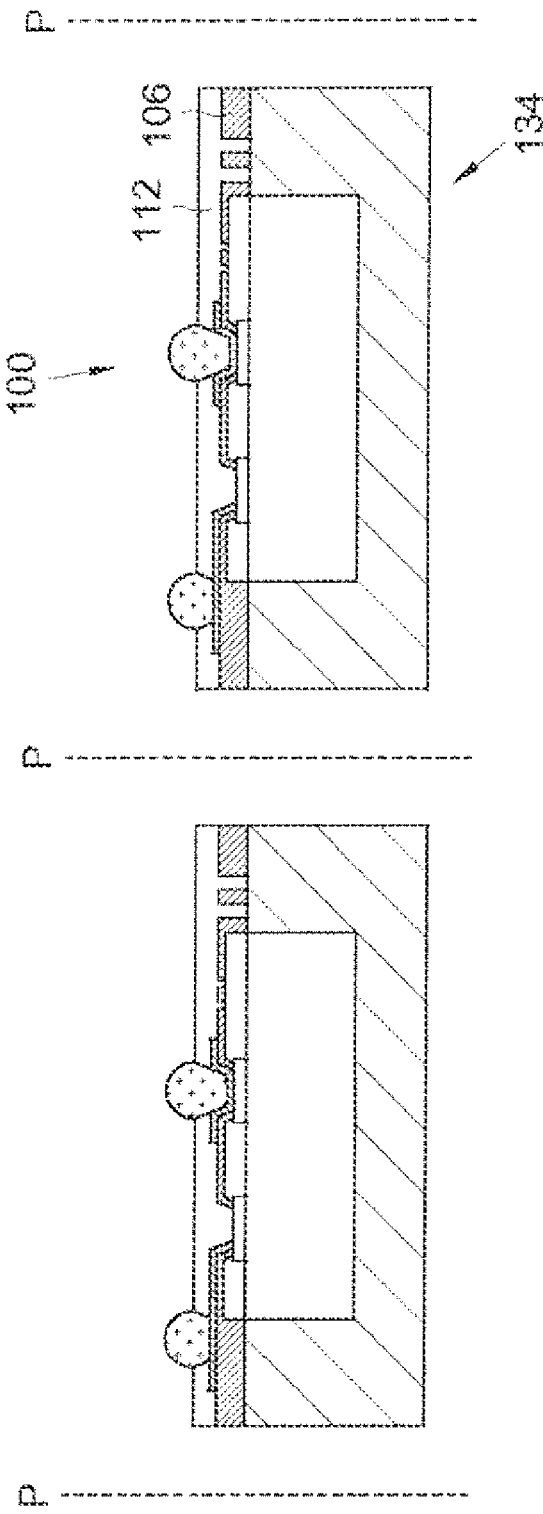

In operation S218, as indicated in FIG. 2 and FIG. 3I, the redistribution structure 134, along with the first dielectric layer 106, the electrically conductive layer 108, and the second dielectric layer 112, is sawn or singulated into multiple, individual semiconductor packages, such as a semiconductor package 100, along a sawing path P. In operation S218, a cutting or sawing tool references the alignment mark 110(3) (as indicated in FIG. 3E) to perform singulation. Alternatively, or in conjunction, singulation can be carried out by referencing the alignment dies. According to a precision level desired for singulation, the alignment mark 110(3) or the alignment dies can be selected.

Figure 6:
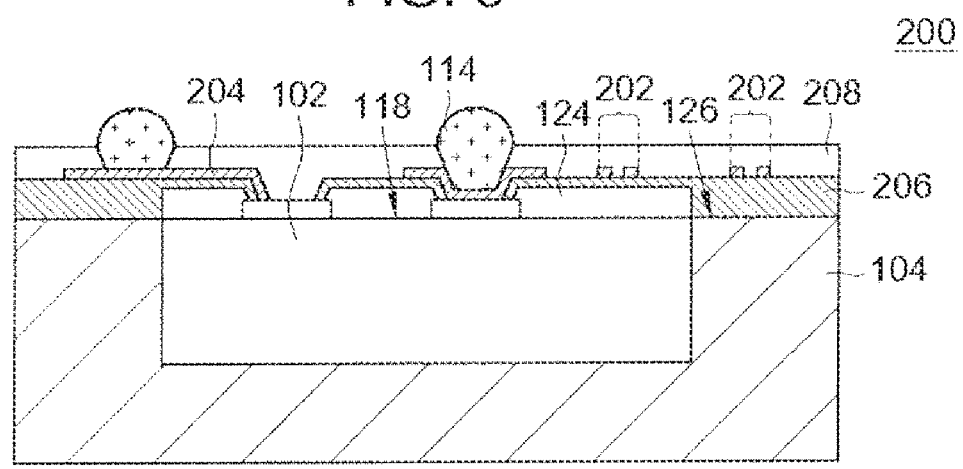
FIG. 6 shows a semiconductor device package according to another embodiment of the disclosure.

Referring to FIG. 6, a semiconductor device package 200 according to a second embodiment of the disclosure is shown. In the second embodiment, for components similar to those of the first embodiment, similar designations are used, and further discussion on those components are not repeated here. In contrast to the semiconductor package 100 of the first embodiment, the semiconductor package 200 of the second embodiment includes a set of alignment marks 202 that are formed in a patterned, electrically conductive layer 204.

Figure 7:
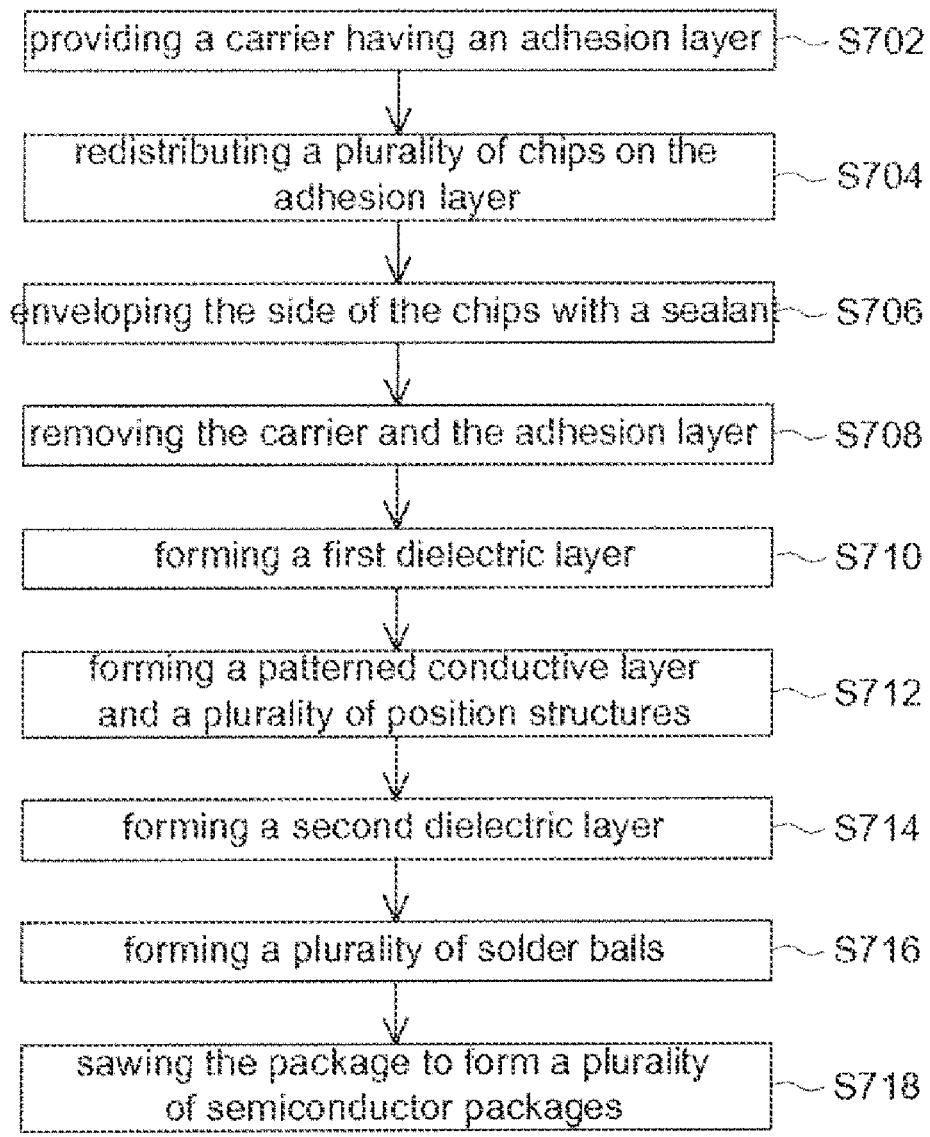
FIG. 7 shows a flow chart of a manufacturing method to form the semiconductor device package of FIG. 6, according to an embodiment of the disclosure.
Figure 8A:
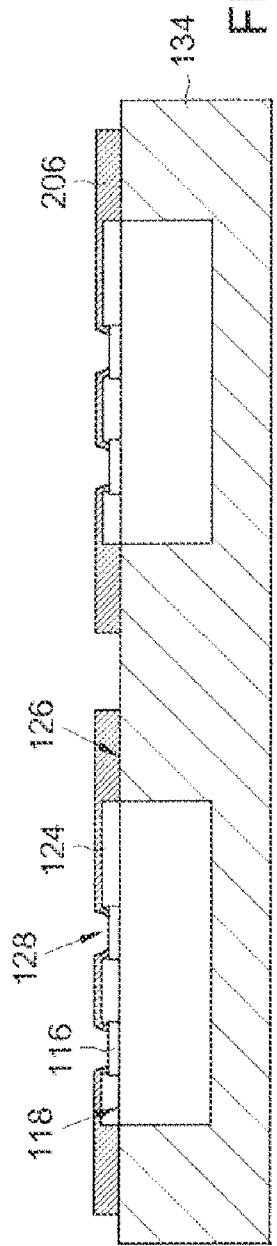
FIG. 8A through FIG. 8C show operations of a manufacturing method to form the semiconductor device package of FIG. 6, according to an embodiment of the disclosure.
Figure 8B:
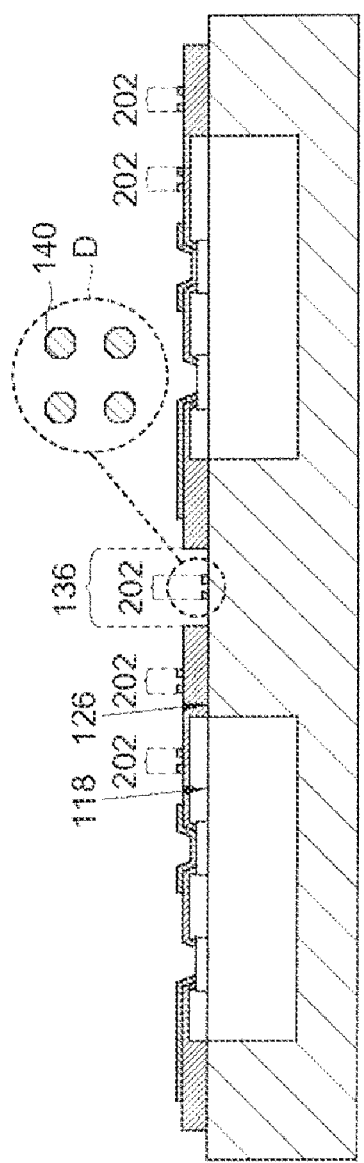
Figure 8C:
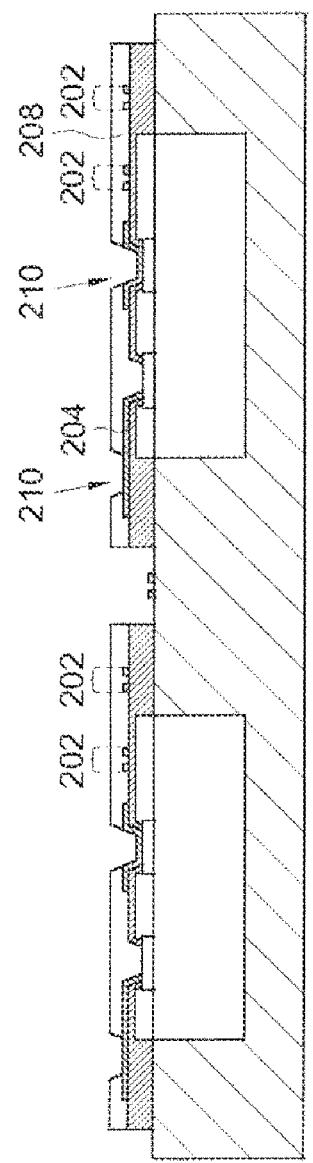

Referring to FIG. 7, a manufacturing method of the semiconductor package 200 according to the second embodiment of the disclosure is shown. Referring to FIG. 8A through FIG. 8C, various operations or stages of the manufacturing method are shown.

Operations S702 through 5708, which correspond to operations to form a redistribution structure 134, are similar to operations S202 through 5208 of FIG. 2, and are not repeated here. The following discussion starts with operation S710.

In operation S710, as indicated in FIG. 7 and FIG. 8A, a first dielectric layer 206 is formed adjacent to a sealant surface 126 and a passivation layer 124, which is above an active, surface 118. The first dielectric layer 206 is formed with multiple, first apertures 128 for exposing pads 116.

In operation S712, as indicated in FIG. 7 and FIG. 8B, an electrically conductive layer 204 is formed adjacent to the first dielectric layer 206 and is electrically connected to the pads 116.

In operation S712, alignment marks 202 are formed in conjunction. That is, the alignment marks 202 and the electrically conductive layer 204 can be formed using the same exposure process. Like the alignment marks 110 of the first embodiment, the alignment marks 202 overlap at least one of the sealant surface 126, the active surface 118, and a sawing path 136.

The shape and the number of recesses or protrusions of the alignment marks 202 can be similar to those of the alignment marks 110 of the first embodiment. As indicated in the partial enlargement of the area D of FIG. 8B, each alignment mark 202 can include multiple protrusions, namely four cylindrical protrusions 140, arranged according to a particular spatial pattern, such as according to corners of a polygonal shape or four corners of a rectangle, and disposed within or surrounded by a recess. While a thickness of the protrusions 140 substantially corresponds to that of a remaining portion of the electrically conductive layer 204, the thickness of the protrusions 140 can vary for other embodiments, and, for example, the protrusions 140 can extend above (or be recessed below) a top surface of a remaining portion of the electrically conductive layer 204. However, this arrangement is by way of example. As long as a mask can be precisely aligned in subsequent processes, the alignment marks 202 can include a set of recess, a set of protrusions, or both, a cross-sectional shape of the alignment marks 202 can be any of a number of shapes, and the number of recesses or protrusions can be suitably selected or adjusted to vary from that shown in FIG. 8B.

Once the alignment marks 202 are formed, a mask alignment tool can reference the alignment marks 202 to position a mask at an exposure position to form a next layer, such as a second dielectric layer 208 illustrated in FIG. 8C.

In operation S714, as indicated in FIG. 7 and FIG. 8C, the second dielectric layer 208 is formed adjacent to the electrically conductive layer 204. The second dielectric layer 208 is formed with multiple, second apertures 210 for exposing contact surfaces of the electrically conductive layer 204.

In operation S714, a mask alignment tool can reference the alignment marks 202 to position a mask at an exposure position to form the second dielectric layer 208.

Like the alignment marks 110 of the first embodiment, the alignment marks 202 are formed after chips are redistributed, thereby avoiding or reducing alignment bias that can occur in conventional packaging technology. In operation S714, the mask can be aligned according to the alignment marks 202, which are formed after redistribution of the chips, so that the second dielectric layer 208, which is formed after the electrically conductive layer 204, can be formed with a high level of precision. That is, in the second embodiment of the disclosure, the second apertures 210 of the second dielectric layer 208 can be precisely formed at desired positions for exposing the contact surfaces of the electrically conductive layer 204 and for precise placement of solder balls to be electrically connected to the electrically conductive layer 204.

The subsequent operations S716 through S718 are similar to operations S216 through S218 of FIG. 2, and are not repeated here.

According to the semiconductor packages, redistribution structures, and manufacturing methods disclosed in the above embodiments, a set of alignment marks are formed after chip redistribution. In a subsequent exposure process, a mask can be aligned according to the alignment marks formed after chip redistribution, hence avoiding or reducing alignment bias that can otherwise occur as a result of chip redistribution. Thus, subsequently formed layers, such as an electrically conductive layer and a second dielectric layer, can have a high level of precision, and the electrically conductive layer can include thinner traces and smaller intervals between the traces. As a result, a size of a resulting semiconductor package can be further reduced.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
   a semiconductor device including an active surface, side surfaces, and contact pads disposed adjacent to the active surface;
   a sealant enveloping the side surfaces of the semiconductor device and exposing the contact pads;
   a first dielectric layer disposed adjacent to the sealant and the active surface of the semiconductor device; and
   an electrically conductive layer disposed adjacent to the first dielectric layer and electrically connected to the contact pads,
   wherein the first dielectric layer is formed with an alignment mark, the alignment mark being at least one protrusion and at least one recess of a material of the first dielectric layer, and the alignment mark is laterally disposed so as to overlap at least one of the sealant and the active surface of the semiconductor device.

2. The semiconductor device package according to claim 1, further comprising a second dielectric layer overlying portions of the first dielectric layer.

3. The semiconductor device package according to claim 2, wherein the alignment mark defines the at least one recess, and the at least one recess is at least partially filled with a portion of the second dielectric layer.

4. The semiconductor device package according to claim 2, wherein the second dielectric layer overlies the alignment mark.

5. The semiconductor device package according to claim 1, wherein the semiconductor device further includes a passivation layer disposed adjacent to the active surface of the semiconductor device.

6. The semiconductor device package according to claim 5, wherein the alignment mark defines the at least one recess that extends through the first dielectric layer and overlies the passivation layer.

7. The semiconductor device package according to claim 1, further comprising a second dielectric layer, wherein portions of the second dielectric layer overlie the alignment mark.

8. A semiconductor package, comprising:
   a molding material;
   a semiconductor device having an active surface, the semiconductor device being partially embedded in the molding material such that the active surface is exposed; and
   a set of layers extending from the active surface to outside a lateral periphery of the semiconductor device, the set of layers including a first layer being formed with an alignment mark, the alignment mark being at least one recess and at least one protrusion formed in a material of the first layer.

9. The semiconductor package of claim 8, wherein the alignment mark is disposed within the lateral periphery of the semiconductor device.

10. The semiconductor package of claim 8, wherein the alignment mark is disposed outside the lateral periphery of the semiconductor device and within a lateral periphery of the molding material.

11. The semiconductor package of claim 8, wherein the set of layers further includes:
    a first dielectric layer overlying a surface of the molding compound and the active surface of the semiconductor device; and
    an electrically conductive layer overlying the first dielectric layer and electrically connected to a contact pad disposed on the active surface of the semiconductor device,
    wherein at least one of the first dielectric layer and the electrically conductive layer is formed with the alignment mark.

12. The semiconductor package of claim 8, wherein the set of layers further includes:
    a first dielectric layer overlying a surface of the molding compound and the active surface of the semiconductor device, the first dielectric layer being formed with the alignment mark; and
    a second dielectric layer overlying the first dielectric layer, the second dielectric layer having a surface pattern substantially corresponding with the alignment mark.

13. The semiconductor package of claim 8, wherein the set of layers further includes:
    a first dielectric layer overlying a surface of the molding compound and the active surface of the semiconductor device, the first dielectric layer being formed with the alignment mark, the alignment mark having the at least one recess; and
    a second dielectric layer overlying at least portions of the first dielectric layer, portions of the second dielectric layer at least partially filling the at least one recess.

14. The semiconductor package of claim 8, wherein the set of layers further includes:
    a first dielectric layer overlying a surface of the molding compound and the active surface of the semiconductor device, the first dielectric layer being formed with the alignment mark; and a second dielectric layer overlying at least portions of the first dielectric layer.

15. A semiconductor package, comprising:
a semiconductor device having an active surface;
a package body partially encapsulating the semiconductor device so that the active surface is exposed from the package body;
an electrically conductive layer extending from the active surface to outside a lateral periphery of the semiconductor device; and
a dielectric layer disposed between the electrically conductive layer and the active surface, the dielectric layer including at least one positioning reference for aligning a mask,
wherein the dielectric layer is formed with at least one recess to provide the at least one positioning reference.

16. The semiconductor package of claim 15, wherein the at least one positioning reference includes multiple positioning references that are laterally spaced apart from one another.

17. The semiconductor package of claim 15, wherein the at least one positioning reference includes a first positioning reference and a second positioning reference, wherein the first positioning reference is disposed within the lateral periphery of the semiconductor device, and the second positioning reference is disposed outside the lateral periphery of the semiconductor device.

18. The semiconductor package of claim 15, wherein the at least one recess includes multiple recesses.

19. The semiconductor package of claim 15, further comprising a second dielectric layer overlying the positioning reference and at least partially extending into the recess.

20. The semiconductor package of claim 15, further comprising a second dielectric layer disposed on the electrically conductive layer, the second dielectric layer having a surface pattern substantially corresponding with the positioning reference.

* * * * *